AUTOMATIC FREQUENCY CONTROLLED MULTI-CHANNEL GENERATOR

Filed Nov. 12, 1963

INVENTOR.
JOHANNES NOORDANUS
GERARDUS ROSIER
BY
Frank R. Trifari
AGENT

United States Patent Office 3,268,831

Patented August 23, 1966

3,268,831
AUTOMATIC FREQUENCY CONTROLLED MULTI-CHANNEL GENERATOR

Johannes Noordanus and Gerardus Rosier, both of Hilversum, Netherlands, assignors to North American Philips Company, Inc., New York, N.Y., a corporation of Delaware Filed Nov. 12, 1963, Ser. No. 322,637
Claims priority, application Netherlands, Nov. 30, 1962, 286,207
10 Claims. (Cl. 331—2)

This invention relates to a multi-channel generator for producing oscillations of high and stable output frequency which is adjustable in rough and fine steps of, for example, 1 c./s. and 10 kc./s., more particularly for use in multi-channel communication connections, the output frequency being derived from an output-frequency oscillator which is stabilized with respect to a rough-step oscillator and a fine-step oscillator by means of an automatic frequency corrector.

In such multi-channel generators, which are used in practice for obtaining a frequency adjustable in very fine steps of, for example, 10 kc./s. over a wide range of frequencies, for example of 30 c./s., special consideration should be given to interference tones and other additional frequencies, since as a result thereof, some of the adjustable channel frequencies cannot be used in practice. The structure of such multi-channel generators becomes complicated especially at very high requirements for suppression of said interference tones and additional frequencies and it is then necessary inter alia to use adjustable filters which moreover render the surveyability of the adjustment much more difficult.

An object of the invention is to provide a special construction of a multi-channel generator of the kind mentioned in the preamble whereby the high requirements for suppression of interference tones and additional frequencies throughout the frequency range are fulfilled by means of simple and fixed filters, while the frequency may be adjusted by electrical means without mechanical switchings.

Another object of the invention is to derive the adjustable frequencies of the multi-channel generator from a single frequency generating crystal or monocrystal and to raise the flexibility, as well as the stability, by means of a suitable division into the constitutive elements.

The multi-channel generator according to the invention is characterized in that the rough-step oscillator and the fine-step oscillator are each included in an auxiliary AFC loop. The AFC loop will include a mixing stage, which fulfils the function of a phase-detector, for producing an AFC control voltage by mixing with a control voltage, the control voltage being mixed with the output voltage from an adjustable frequency-divider connected to the fine-step oscillator, in the mixing stage included in the auxiliary AFC-loop of the fine-step oscillator. The AFC control voltages derived from the mixing stages in the two auxiliary AFC loops control frequency correctors are coupled through a smoothing filter to the rough-step oscillator and the fine-step oscillator, the output frequency signals being derived from an output frequency oscillator which, for automatic frequency correction with respect to the rough-step oscillator and the fine-step oscillator, forms part of a main AFC loop. The main AFC loop includes a first mixing stage coupled to the output frequency oscillator and the rough-step oscillator in order to obtain an intermediate frequency which is low with respect to the frequency of the output frequency oscillator and a second mixing stage which is coupled to the fine-step oscillator and, through a fixed intermediate-frequency filter, to the output of the first mixing stage. A control voltage is derived from the second mixing stage and, through a lowpass filter controls a frequency corrector coupled to the output frequency oscillator.

If desired, the rough-step oscillator may be stabilized by mixing the output voltage, from the rough-step oscillator through an adjustable frequency-divider, with the control voltage in the mixing stage which fulfils the function of a phase detector, but it affords great advantage for the rough-step oscillator, inter alia for realizing a very large control-range, to mix the voltage from the rough-step oscillator with a pulsatory control-voltage in the mixing stage in order to stabilize the voltage of the oscillator on a spectrum component of the pulsatory control spectrum.

In order that the invention may be readily carried into effect, it will now be described in detail, by way of example, with reference to the accompanying diagrammatic drawing, in which.

Figures 1, 2:
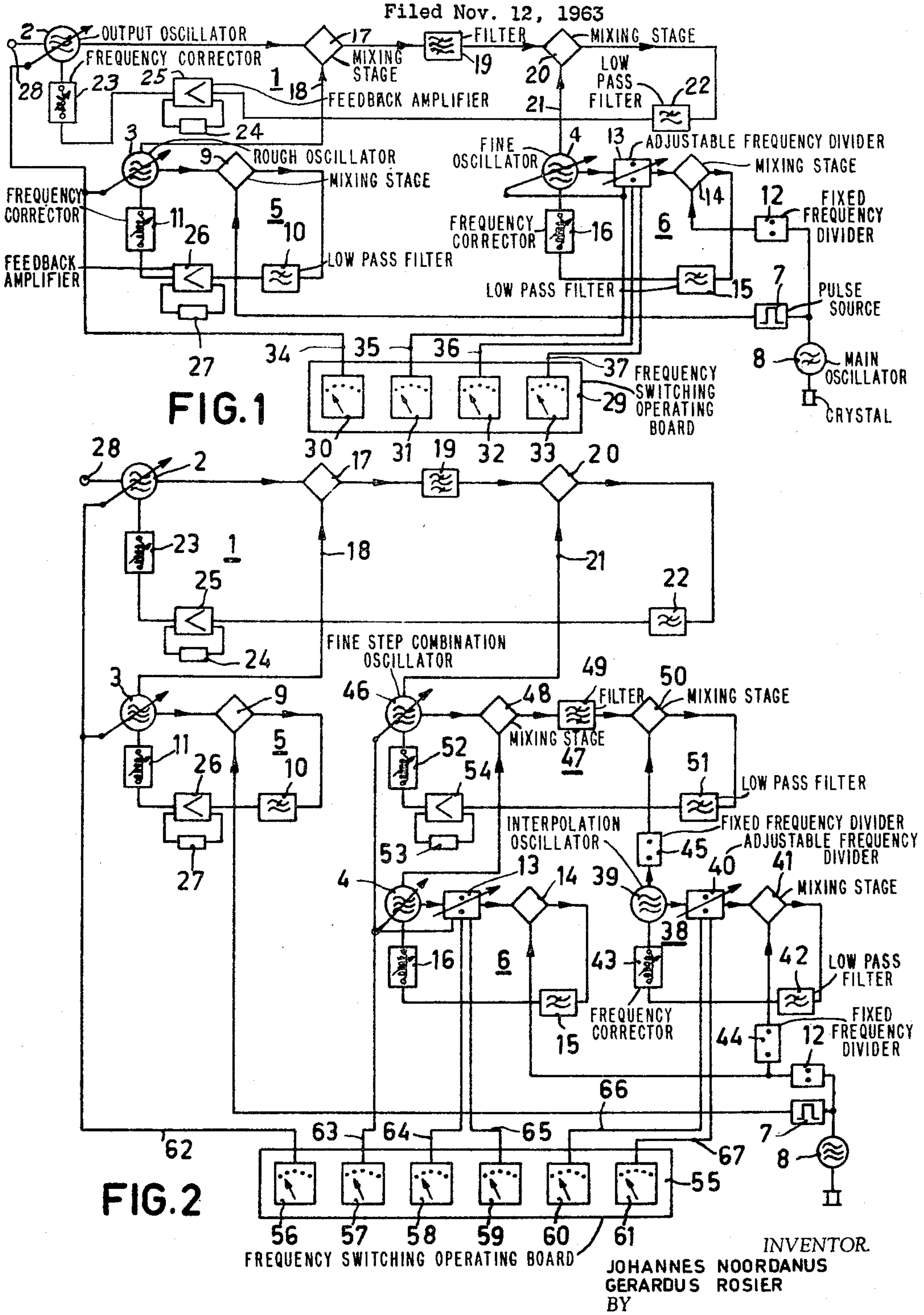
FIGURE 1 shows a multi-channel generator according to the invention.
FIGURE 2 shows a variant of the arrangement of FIGURE 1.

The multi-channel generator shown in FIGURE 1 is designed for producing a frequency which is adjustable in rough steps of 10 mc./s. and in fine steps of 10 kc./s. in the control range of from 70 to 100 mc./s., the output frequency being derived from an output-frequency oscillator 2 included in a main AFC loop 1. The output-frequency oscillator 2 included in the main AFC loop is stabilized by means of automatic frequency-correction with respect to a rough-step oscillator 3 and a fine-step oscillator 4 included in auxiliary AFC loops 5 and 6 respectively. For example, the rough-step oscillator 3 is adjustable in the frequency range from 60 to 80 mc./s. in steps of 10 mc./s. and the fine-step oscillator 4 is adjustable in the frequency range from 10 to 20 mc./s. in steps of 10 kc./s.

To produce the rough steps of 10 mc./s., the rough-step oscillator 3 in the auxiliary AFC loop 5 is stabilized on a pulsatory control spectrum originating from a pulse source 7 which is synchronized by a crystal-controlled main oscillator 8 having a frequency of, for example, 10 mc./s. For this purpose the output voltage of the pulse source 7 and that of the rough-step oscillator 3 are mixed in a mixing stage 9 in the form of a ring modulator, which is built up, for example, of rectifying cells and the output voltage of which constitutes the AFC voltage which controls, through a low-pass filter 10, a frequency corrector 11 coupled to the frequency-determining circuit of the rough-step oscillator 3. As previously mentioned, the rough-step oscillator 3 is adjustable between 60 to 80 mc./s. in steps of 10 mc./s.; the low-pass filter 10 has a limiting frequency of about 70 c./s., so that the rough-step oscillator 3 is synchronized, as a function of its adjusted position, on a spectrum component located between the sixth and eighth harmonic of the pulse recurrence frequency. If the frequency distance of the spectrum components is smaller the limiting frequency of the low-pass filter 10 must naturally be correspondingly lower.

So if the frequency of the rough-step oscillator 3 is brought near one of the spectrum components of the control spectrum by means of a rough control, exact stabilization of frequency on the relevant spectrum component occurs and the rough-step oscillator 3 is thus adjustable from 60 to 80 mc./s. in rough steps of 10 mc./s. Essentially the frequency of the stabilizing spectrum component only occurs in the output voltage of the rough-step oscillator 3, the other spectrum components being attenuated to a very great extent. For example, in the embodiment shown, the attenuation factor was about 100 db for the strongest undesirable component of the control spectrum.

A rough-step oscillator 3 exactly adjustable in steps of 10 mc./s. is thus obtained, the sinusoidal output voltage of which is applied, substantially free from interference components, for further handling to the main AFC loop 1, as will be explained in detail hereinafter.

To produce the fine steps of 10 kc./s., the fine-step oscillator 4 in the auxiliary AFC loop 6 is stabilized by a control frequency obtained from a main oscillator 8 by frequency division in a fixed frequency divider 12. For example, in the frequency divider 12 shown, the frequency of the main oscillator 8 is divided by a factor of 1000 for obtaining a control frequency of 10 kc./s. For the frequency stabilization of the oscillator 4 the output voltage of the fine-step oscillator 4, after frequency division in an adjustable frequency divider 13 by a divisor adjustable at will between 1,000 and 2,000, is mixed with the control frequency of 10 kc./s. in a mixing stage 14 which may be of the ring modulator type the output voltage of which constitutes the AFC voltage which controls through a lowpass filter 15 having a limiting frequency of 4 kc./s. a frequency corrector 16 coupled to the frequency-determining circuit of the fine-step oscillator 4. In this connection it is to be noted that adjustable frequency dividers are known per se, reference being made, for example, to the journal "Electronics" of March 1947, pages 120–123 and "Electronics" of February 1948, pages 88 to 93.

If in this device the frequency of the oscillator, which has been divided by a given divisor $p$ in the adjustable frequency-divider 13, exactly corresponds in frequency to the control frequency of 10 kc.s., that is to say if the frequency of the oscillator is equal to $p\times 10$ kc.s., mixing in the mixing stage 14 results in a direct AFC-control voltage which stabilizes the frequency of the oscillator through the lowpass filter 15 having a limiting frequency of, say, 4 kc./s. via the frequency corrector 16. If the frequency of the oscillator deviates from the frequency $p\times 10$ kc./s. an alternating voltage of difference frequency occurs in the mixing stage and brings about a variation in the frequency of the oscillator through the frequency corrector 16 until with equality of the control frequency and the oscillator frequency supplied through the frequency divider 13 to the mixing stage 14, the oscillator frequency is caught and the fine-step oscillator 4 is synchronised on the desired frequency of $p\times 10$ kc./s.

When the frequency of the oscillator is thus roughly adjusted to the desired frequency and the divisor of the frequency divider 13 is adjusted in succession to the values $p$, $p+1$, $p+2$ . . . etc., the frequency of the fine-step oscillator 4 will thus be stabilized in the frequency range of 10 to 20 mc./s. in succession on the values $p\times 10$ kc./s., $(p+1)\times 10$ kc./s., $(p+2)\times 10$ kc./s., etc., which frequencies are applied for further handling to the main AFC-loop 1.

While a frequency adjustable in rough steps of 10 mc./s. is obtained on the rough-step oscillator 3 through the frequency range of 60 to 80 mc./s. with avoidance of interference components, which frequency is thus a whole multiple of the frequency of 10 mc./s. of the main oscillator, a sinusoidal oscillation adjustable in fine steps of 10 kc./s. is obtained from the same main oscillator 8 on the fine-step oscillator 4 via a rough step of 10 mc./s., namely from 10 to 20 mc./s., by frequency division in the auxiliary AFC loop 6, which sinusoidal oscillation is substantially free from interference components with suitable construction of the lowpass filter 15, the interference level being, for example, less than 100 db. Since both the rough-step oscillator 3 and the fine-step oscillator 4 are stabilized by the frequency of the common main oscillator 8, it is preferable to use a high-quality crystal in the main oscillator 8. For example, crystals of 10 mc./s. are now commercially sold which have a frequency stability of $10^7$–$10^8$ for a period of several months.

The combination of the frequencies of the rough-step oscillator 3 and the fine-step oscillator 4 for producing a frequency adjustable in rough steps of 10 mc./s. and in fine steps of 10 kc./s. in the frequency range of from 60 to 80 mc./s. is effected in the main AFC loop 1 the function of which is to stabilize the output frequency oscillator 2 with respect to the rough-step oscillator 3 and the fine-step oscillator 4 by means of automatic frequency correction. For this purpose the output signal from the output frequency oscillator 2 is applied to a mixing stage 17 in the form of a ring modulator which has also applied to it the output signal from the rough-step oscillator 3 through a lead 18. The intermediate frequency in the frequency band 10–20 mc./s. which is obtained in the mixing stage 17 by mixing the output signals from the output frequency oscillator 2 and the rough-step oscillator 3, which are adjustable in the frequency ranges of 70 to 100 mc./s. and 60 to 80 mc./s. respectively, is filtered out by means of a fixed intermediate-frequency filter 19 having a pass band of 10 to 20 mc./s. and applied to a second mixing stage 20 which may be of the ring modulator type to the output of which is also connected the fine-step oscillator 4 through a lead 21. The fine-step oscillator which, as previously mentioned, is adjustable in the frequency range of 10–20 mc./s. in steps of 10 kc./s. delivers an AFC control voltage to the mixing stage 20 via lead 21 along with an intermediate frequency signal derived from the intermediate-frequency filter 19. The AFC-control voltage is then applied through a lowpass filter 22 to a frequency corrector 23 which is in turn coupled to the frequency-determining circuit of the output frequency oscillator 2.

As previously mentioned hereinbefore, the function of the main AFC loop 1 is to stabilize the frequency of the output frequency oscillator 2 on a value determined by the frequency of the rough-step oscillator 3 and the fine-step oscillator 4. If, for example, a frequency of 82.260 mc./s. is desired in the multi-channel generator, the output frequency generator 2 is adjusted approximately to this frequency, the rough-step oscillator to 70 mc./s. and the fine-step oscillator 4 to 12.260 mc./s. by adjusting the divisor of the adjustable frequency divider 13 to 1,226. In fact, upon this adjustment, mixing of the output voltages from the output frequency oscillator 2 and the rough-step oscillator 3 in the mixing stage 17 results in a frequency of 12.260 mc./s. which, by mixing with the output voltage of 12.260 mc./s. from the fine-step oscillator 4, delivers a control voltage serving for automatic frequency correction of the output frequency oscillator 2 on the desired value of 82.260 mc./s.

If at a limiting frequency of, for example, 700 c./s. of the smoothing filter 22 the frequency of the output frequency oscillator 2 initially deviates by 3 mc./s. from the desired frequency 82.260 mc./s., and is thus adjusted, for example, to 15 mc./s., automatic stabilisation does not occur since the resulting difference frequency cannot pass the lowpass filter 22. To bring about automatic catching in the main AFC loop under these conditions, a search voltage oscillator is arranged between the lowpass filter 22 and the frequency corrector 23 in the form of a control amplifier 25, provided with a positive feedback coupling 24, which delivers a search voltage of a very low frequency, of about 50 c./s., in the absence of stabilization. Said search voltage occurs in the control lead and causes through the frequency corrector 23 a slow frequency modulation of, for example, ±6 mc./s. of the output frequency oscillator 2 until the point of synchronism is reached, that is to say 82.260 mc./s. As soon as the point of synchronism is reached the search voltage generator 24, 25 stops oscillating as a result of the stabilization of the output frequency oscillator 2 which then occurs in the main AFC loop 1 and it acts further as an amplifier for the AFC control voltage.

For the same reason the AFC loop 5 of the rough-step oscillator 3 includes a search voltage oscillator or generator comprising a control amplifier 26 with a positive feedback coupling 27, whereas such a search voltage generator for realizing frequency stabilization is not required in the AFC loop 6 including the adjustable frequency divider 13. In this connection it is to be noted that search voltage generators are known in different forms (cf. British patent specifications No. 685,991 and No. 721,106).

A frequency adjustable in the frequency range of 70 to 100 mc./s. in rough steps of 10 mc./s. and in fine steps of 10 kc./s. is thus obtained from the single main oscillator 8 by means of the rough-step oscillator 3 and the fine-step oscillator 4 in the auxiliary AFC-loops 5 and 6, which are especially designed for this purpose, together with the output frequency oscillator 2 in the main AFC loop 1, said frequency being derived for further handling, for example, in communication equipment, from an output terminal 28 connected to the output frequency oscillator 2.

With the described structure of the multi-channel generator, comprising the rough-step oscillator 3 in the AFC loop 5, which acts as a frequency multiplier, the fine-step oscillator 4 in the division loop 6 and the output frequency oscillator 2 in the AFC loop, which acts as a combination loop, it is found when using fixed filters that the interference lever caused by interference tones and other additional frequencies lies below 80 to 90 db throughout the frequency range of 70 to 100 mc./s. As previously mentioned, especially the interference level of the sinusoidal alternating output voltages from the rough-step oscillator 3 and the fine-step oscillator 4 in the auxiliary AFC loops 5, 6 is less than 100 db and it is found that in the described device interference frequencies and additional frequencies can occur only in the mixing of the output voltages from the output frequency oscillator 2 and the rough step oscillator 3 in the mixing stage 17, which frequencies insofar present and passed by the filters, may be divided into two groups, namely if the frequency of the output frequency oscillator 2 is assumed as $f_x$ and the frequency of the rough-step oscillator 3 as $f_0$, the first group of interference frequencies is of the kind $2f_x-2f_0$; $3f_x-3f_0$; $4f_x-4f_0$ and that of the second group is of the kind $3f_0-2f_x$; $4f_0-3f_x$; $5f_0-4f_x$ . . . .

However, both groups of interference frequencies have a very low level, since in the first place these interference frequencies are of high order and for this reason already have a low level and in the second place, if the mixing stage 17 is of the push-pull type in the form of a ring modulator, said intereference frequencies are considerably attentuated further because such a ring modulator delivers only frequencies of the kind $f_x \pm f_0$; $3f_x \pm f_0$; $5f_x \pm f_0$ . . . while greatly suppressing the other combination frequencies. Besides, the interference frequencies of the kind $2f_x-2f_0$; $3f_x-3f_0$; $4f_x-4f_0$, . . . , which vary as harmonics in synchronism with the desired combination frequency $f_x-f_0$, are attenuated further by applying the output signal from the intermediate-frequency filter 19, which contains the said interference frequency together with the desired combination frequency $f_x-f_0$ of high level, as a switching signal to the mixing stage 20 formed as a ring modulator. Thus, in the described multi-channel generator, a frequency adjustable in steps of 10 kc./s. was obtained over the very broad frequency range of 70 to 100 mc./s., the interference level being lower than 80 to 90 db throughout the frequency range with the use of the simplest and fixed filters.

The functional division of the described multi-channel generaltor into its elements, namely the AFC loop 5 acting as a frequency multiplier stage and including the rough-step oscillator 3, the fine-step oscillator 4 included in the division loop 6, and the combination AFC-loop 1 including the output frequency oscillator 2, renders the structure of each of these elements very simple with the simplest filter constructions. On the one hand, an optimum stability is thus realized for each of the constitutive AFC-loops 1, 5, 6 and, on the other hand, the flexibility is considerably raised. For example, in order to render the described multi-channel generator suitable for another frequency range or another division of steps, only a minimum number of elements need be modified.

This multi-channel generator has, together with the said advantages namely reduction of the interference level over the whole frequency range below 80 to 90 db when using simple and fixed filters, simplicity in structure, optimum stability and flexibility, the further advantage very important in practice that the described device is highly suitable for a purely electrical adjustment of frequency. In fact, in order to adjust the multi-channel generator to a given frequency in the whole control range of 70 to 100 mc./s., it is necessary only for the output frequency oscillator 2, the rough-step oscillator 3, the fine-step oscillator 4 and the adjustable frequency divider 13 to be adjusted to the desired values without switching of the filters, whilst the accuracy of the frequency adjustment of the oscillators need not fulfil special requirements since the frequencies of these oscillators 2, 3, 4 are adjusted to their correct values by the AFC controls, while also the electrical adjustment of the adjustable frequency divider 13 is very simple.

For the frequency adjustment the described arrangement includes an operating board 29 having four operating switches 30, 31, 32, 33 which serve in this succession to adjust the 10 mc./s., 1 mc./s., 100 kc./s. and 10 kc./s. steps by means of a control voltage. More particularly the 10 mc./s. operating switch 30 controls the output frequency oscillator 2 and the rough-step oscillator 3 through a lead 34, the 1 mc./s. operating switch 31 controls the fine-step oscillator 4 through a lead 35 and also the adjustable frequency divider 13, which is also controlled through leads 36, 37 by the 100 kc./s. and the 10 kc./s. operating switches 32 and 33. Electrical control of the adjustment oscillators is known per se (cf., for example, British patent specification No. 886,298) and need therefore not be described in detail in the present application. The electrical control of adjustment may be obtained in a simple manner more particularly by using diodes each acting as a switch which switches over, for example, the frequency determining circuit of the oscillator by means of a control voltage, whereas the adjustable frequency divider 13 may be electrically adjusted in the manner described in the aforementioned articles in the journal "Electronics."

The decade structure of the operating board 29 permits a frequency adjustment which is very simple and surveyable. If, for example, it is desired to adjust the multi-channel generator to the frequency of 82.260 mc./s. the operating switches 30, 31, 32, 33 are adjusted in this sequence to the values 8, 2, 2, 6 so that the output frequency oscillator 2, the rough-step oscillator 3 and the fine-step oscillator 4 are roughly adjusted to 80 mc./s., 70 mc./s. and 12 mc./s. respectively, whilst the divisor of the adjustable frequency divider is adjusted to 1,226. In the manner as previously explained hereinbefore, upon these adjustments of the oscillators 2, 3, 4 and of the adjustable frequency divider 13, the frequency of the output frequency oscillator 2 will be exactly stabilized on the desired value 82.260 mc./s. by the AFC control in the AFC loops.

In this manner not only a frequency adjustment is obtained which is very simple and surveyable, but also a considerable improvement in the stability of the frequency of the output oscillator is obtained because with the purely electrical adjustment of frequency all the elements of the multi-channel generator can be fixedly arranged so that there is no risk of the frequency of the output oscillator being influenced by mechanical oscillations which could easily bring about frequency variations of several tens or several hundreds of c./s. at such high oscillating frequencies. Thus, in the arrangement according to the invention it is made possible to use the influencing of the output frequency oscillator 2 by mechanical vibrations to fractions of one c./s.

FIGURE 2 shows a variant of the arrangement of FIGURE 1, in which a finer adjustment of frequency is obtained by making use of the high stability of frequency, more particularly the output frequency oscillator 28 is now adjustable over the frequency range of 70 to 100 mc./s. in fine steps of 100 c./s. Corresponding elements are indicated by the same reference numerals.

For the fine adjustment of frequency, the multi-channel generator shown includes, in addition to a fine-step oscillator 4 which gives fine steps of 10 kc./s., an interpolation fine-step oscillator 39, included in a third auxiliary AFC loop 38, which delivers interpolation fine steps of 100 c./s. The auxiliary AFC loop 6 of the fine-step oscillator 4 is essentially identical with that of the fine-step oscillator 4 shown in FIGURE 1, only the frequency of the fine-step oscillator is now adjustable between 9 and 19 mc./s. and the divisor of the adjustable frequency divider 13 between 900 and 1,900, while the third auxiliary AFC loop 38 of the interpolation fine-step oscillator 39 corresponds in structure to that of the fine-step oscillator 4.

More particularly the third AFC loop 38 includes in succession an interpolation fine-step oscillator 39 which is adjustable between 25 and 25.25 mc./s., an adjustable frequency divider 40 having a divisor which is adjustable between 10,000 and 10,100, and a mixing stage 41 which may be of the ring modulator type which acts as a phase detector and the output voltage of which is applied through a low-pass filter 42 having a limiting frequency of, for example, 1200 c./s. as an AFC-control voltage to a frequency corrector 43 coupled to the interpolation fine-step oscillator 39. The mixing stage 41 has applied to it for AFC control a control frequency of 2,500 c./s. which is derived from the 10 kc./s. control frequency originating from the frequency divider 12 by means of frequency division in a fixed division stage 44 having a divisor 4.

In the manner as already explained in detail with reference to FIGURE 1, by adjusting the divisor of the adjustable frequency divider 40 between 10,000 and 10,100, a frequency adjustable between 25 and 25.25 mc./s. in steps of 2500 c./s. is derived from the interpolation fine-step oscillator 39, resulting in a frequency adjustable between 1.00 mc./s. and 1.01 mc./s. in the desired interpolation fine-steps of 100 c./s. obtained by frequency division in a fixed frequency divider 45 having a divisor 25, which is connected to the output of the interpolation fine-step oscillator. Instead of deriving the interpolation fine-steps of 100 c./s. directly from the interpolation fine-step oscillator, for which purpose a control frequency of 100 c./s. would be required, in the described arrangement it is achieved that the considerably higher control frequency of 2,500 c./s. suffices for producing the interpolation fine-steps of 100 c./s., which is very advantageous for the structure of the auxiliary AFC-loop 38, because inter alia the structure of the low-pass filter 42 and the stabilization requirements of the AFC loop 38 are thus considerably simplified.

In this manner the arrangement described has got the disposal of a rough-step oscillator 3 having a frequency which is adjustable in the frequency range from 60 to 80 mc./s. in steps of 10 mc./s., a fine-step oscillator 4 which is adjustable in the frequency range of 9 to 19 mc./s., that is to say over a rough step of 10 mc./s. in steps of 10 kc./s., and an interpolation fine-step oscillator 39 which is adjustable over a fine-step of 10 kc./s. in the frequency range of 1.00 to 1.01 mc./s. in steps of 100 c./s., a frequency thus being obtained which is adjustable over the frequency range of 70 to 100 mc./s. in steps of 100 c./s by combination of the output frequencies of the said three oscillators 3, 4 and 39.

To reduce in this combination the interference level throughout the control range below 80 to 90 db when using fixed filters, the fine steps and the interpolation fine-steps are first used for stabilizing an output frequency-fine-step oscillator 46 included in a fine-step combination loop 47, the output voltage of the output frequency-fine-step oscillator 46 thus stabilizing the output frequency oscillator 2 in the main AFC loop in the manner as previously explained with reference to FIGURE 1.

The structure of the fine-step combination loop 47 is identical with that of the main AFC loop 1. More particularly in the fine-step combination loop 47 the output voltage of the output frequency-fine-step oscillator 46, which is adjustable in the frequency range of 9 to 19 mc./s., is mixed with the output voltage of the fine-step oscillator 4 in a first mixing stage 48. The intermediate frequency resulting in the mixing stage is mixed through a fixed intermediate-frequency filter 49 in the form of a low-pass filter having a limiting frequency of 1.5 mc./s. with the output voltage of the interpolation fine-steps derived from the division stage 45 in a second mixing stage 50 the output voltage of which is applied for AFC-control through a low-pass filter 51 having a limiting frequency of 70 c./s. to a frequency corrector 52 coupled to the output frequency-fine-step oscillator 46. To obtain automatic stabilization of the output frequency fine-step oscillator 46 under any conditions, a control amplifier 54 provided with a positive feedback coupling 53 is provided, as in the main AFC loop 1, between the lowpass filter 51 and the frequency corrector 52, which control amplifier delivers a low-frequency search voltage in the absence of stabilization and acts as a control-voltage amplifier upon stabilization.

The described fine-step combination loop 47 permits the output frequency-fine-step oscillator 46 to be adjusted over the control range of 10 to 20 mc./s. in interpolation fine-steps of 100 c./s. which bring about, together with the output voltage of the rough-step oscillator 3 in the main AFC loop 1, a stabilization of the output frequency oscillator 2 over its frequency range of 70 to 100 mc./s. in interpolation fine-steps of 100 c./s. If, for example, the described multi-channel generator is desired to produce a frequency of 82.2634 mc./s. then a frequency of 1.0034 mc./s. is derived from the frequency divider 45 connected to the output of the interpolation fine-step oscillator 39 by adjusting to 10,034 the divisor of the adjustable frequency divider 40 included in the AFC loop 38 a frequency of 11.2600 mc./s. is derived from the fine-step oscillator 4 by adjusting the divisor of the adjustable frequency divider 13 to 1,126, and a frequency of 70.0000 mc./s. is derived from the rough-step oscillator 3, resulting in the frequency of the output frequency oscillator 2 being automatically stabilized on the desired value of 82.2634 mc./s. In fact, the output frequency-fine-step oscillator 46 in the fine-step combination loop 47 is stabilized on a frequency of 12.2634 mc./s. by the frequency of 11.2600 mc./s. of the fine-step oscillator 4 and the frequency of 1.0034 mc./s. of the interpolation fine-step oscillator 39, said frequency stabilizing in the main AFC loop 1, together with the output frequency of 70 mc./s. of the rough-step oscillator 3, the output frequency oscillator 2 on the desired frequency of 82.2634 mc./s. In the described structure of the multi-channel generator not only the structure and the stability requirements become very simple, but it is thus also rendered possible with fixed and simple filters to reduce the interference level below 80 to 90 db over the whole frequency range of 70 to 100 mc./s. adjustable in interpolation fine-steps of 100 c./s.

The described structure of the multi-channel generator is suitable without further expedients for a completely electrical decade adjustment of frequency, for which purpose the multi-channel generator includes an operating board 55 having six operating switches 56, 57, 58, 59, 60 and 61 which serve to adjust the 10 mc./s., the 1 mc./s., the 100 kc./s., the 10 kc./s., the 1 kc./s. and the 100 c./s. steps respectively. The operating switches 56 to 61 are connected through leads 62, 63, 64, 65, 66, 67 to the various oscillators and adjustable frequency dividers in the following manner:

10 mc./s. operating switch 56 through lead 62 to an output frequency oscillator 2 and the rough-step oscillator 3;
1 mc./s. operating switch 57 through lead 63 to the fine-step oscillator 4, the adjustable frequency divider 13 and the output frequency-fine-step oscillator 46;
100 kc./s. operating switch 58 through lead 64 to the adjustable frequency divider 13;
10 kc./s. operating switch 59 through lead 65 to the adjustable frequency divider 13;
1 kc./s. operating switch 60 through lead 66 to the adjustable frequency divider 40;
100 c./s. operating switch 61 through lead 67 to the adjustable frequency divider 40.

If, for example, the output frequency oscillator 2 is desired to be adjusted to the frequency of 82.2634 mc./s. specified in the previous example, the operating switches 56, 57, 58, 59, 60, 61 are adjusted to the values 8, 2, 2, 6, 3, 4 respectively, so that the oscillators 2, 3, 4 are roughly adjusted to 80 mc./s., 70 mc./s. and 10 mc./s. respectively and the divisors of the adjustable frequency dividers 13 and 40 are adjusted to 1,126 and 10,034 respectively. Due to this adjustment, the frequency of the output frequency oscillator 2 will be automatically adjusted to the desired value of 82.2634 mc./s. by the AFC actions of the various AFC loops.

What is claimed is:

1. A multichannel generator for producing a stabilized oscillation adjustable in rough and fine frequency steps comprising an output oscillator having an output signal of a frequency variable in accordance with variations of a first intermediate signal applied thereto, a main automatic frequency control loop for providing said oscillator with said first intermediate signal and including a first mixing stage having an input coupled to the output of said oscillator, a second mixing stage having an input coupled to the output of said first mixing stage and means for applying the output of said second mixing stage to said oscillator, a rough step oscillator having an output signal variable in frequency in accordance with variations of a second intermediate signal applied thereto, an automatic frequency control loop for providing said rough step oscillator with said second intermediate signal and including a rough step mixer having an input coupled to the output of said rough step oscillator and means coupling the output of said rough step mixer to said rough step oscillator, a fine-step oscillator having an output signal variable in frequency in accordance with variations of a third intermediate signal applied thereto, an automatic frequency control loop for providing said fine step oscillator with said third intermediate signal and including an adjustable frequency divider having an input coupled to the output of said fine step oscillator, a fine step mixer having an input coupled to the output of said adjustable frequency divider and means coupling the output of said fine step mixer to said fine step oscillator, a control frequency signal source, first means coupling said source to another input of said rough step mixer, second means coupling said source to another input of said fine step mixer, means coupling the output frequency signal of said rough step oscillator to another input of said first mixing stage, and means coupling the output frequency signal of said fine step oscillator to another input of said second mixing stage.

2. A multi-channel generator as claimed in claim 1, wherein the rough-step oscillator output signal is mixed in said rough step mixer with a pulsatory control voltage for stabilizing the frequency of the rough-step oscillator on a spectrum component of the pulsatory control voltage.

3. A multi-channel generator as claimed in claim 2, wherein said control frequency signal source includes a crystal controlled main oscillator, said main oscillator being connected through a pulse source to the rough-step mixer and connected through a frequency divider to the fine-step mixer.

4. A multi-channel generator as claimed in claim 2 wherein the main automatic frequency control loop and the automatic frequency control loop of the rough-step oscillator each include a search-voltage oscillator.

5. A multi-channel generator as claimed in claim 2 wherein the multi-channel generator includes an operating board having a plurality of operating switches which are connected to the output oscillator, the rough-step oscillator, the fine-step oscillator and the adjustable frequency divider for selective adjustment of frequency.

6. A multichannel generator for producing stablized oscillation adjustable in rough and fine frequency steps comprising an output oscillator having an output signal of a frequency variable in accordance with variations of a first intermediate signal applied thereto, a main automatic frequency control loop for providing said oscillator with said first intermediate signal and including a first mixing stage having an input coupled to the output of said oscillator, a second mixing stage having an input coupled to the output of said first mixing stage and means for applying the output of said second mixing stage to said oscillator, a rough step oscillator having an output signal variable in frequency in accordance with variations of a second intermediate signal applied thereto, an automatic frequency control loop for providing said rough step oscillator with said second intermediate signal and including a rough step mixer having an input coupled to the output of said rough step oscillator and means coupling the output of said rough step mixer to said rough step oscillator, a fine step combination oscillator having an output signal variable in frequency in accordance with variations of a third intermediate signal applied thereto, an automatic frequency control loop for providing said fine step combination oscillator with said third intermediate signal and including a first fine step combination mixing stage having an input coupled to the output of said oscillator, a second fine step combination mixing stage having an input coupled to the output of said first fine step combination mixing stage and means applying the output of said second fine step combination mixing stage to said fine step combination oscillator, a fine step oscillator having an output signal variable in frequency in accordance with variations of a fourth intermediate signal applied thereto, an automatic frequency control loop for providing said fine step oscillator with said fourth intermediate signal and including a first adjustable frequency divider having an input coupled to the output of said fine step oscillator, a fine step mixer having an input coupled to the output of said first adjustable frequency divider and means coupling the output of said fine step mixer to said fine step oscillator, a fine step interpolation oscillator having an output signal variable in frequency in accordance with variations of a fifth intermediate signal applied thereto, an automatic frequency control loop for providing said fine step interpolation oscillator with said fifth intermediate signal and including a second adjustable frequency divider having an input coupled to the output of said fine step interpolation oscillator, a fine step interpolation mixer having an input coupled to the output of said second adjustable frequency divider and means coupling the output of said fine step interpolation mixer to said fine step interpolation oscillator, a control freqency signal source, first means coupling said source to another input of said rough step mixer, second means coupling said source to another input of said fine step mixer, third means coupling said source to another input of said fine step interpolation mixer, means coupling the output frequency signal of said fine step oscillator to another input of said first fine step combination mixing stage, means coupling the output frequency signal of said fine step interpolation oscillator to another input of said second fine step combination mixing stage, means coupling the output frequency signal of said rough step oscillator to another input of said first mixing stage, and means coupling the output frequency signal of said fine step combination oscillator to another input of said second mixing stage.

7. A multi-channel generator as claimed in claim 6 wherein the automatic frequency control loop of the fine step combination oscillator includes a search voltage oscillator.

8. A multi-channel generator as claimed in claim 6 wherein the fine step interpolation oscillator is connected through a frequency divider to the second mixing stage of the fine step combination loop.

9. A multi-channel generator as claimed in claim 6 wherein the control frequency for the automatic frequency control loop of the fine step oscillator is supplied through a frequency divider to the mixing stage of the automatic frequency control loop of the fine step interpolation oscillator.

10. A multi-channel generator as claimed in claim 9 including operating switches for frequency adjustment connected to the fine step combination oscillator, and said second adjustable frequency divider.

References Cited by the Examiner

UNITED STATES PATENTS

| | | | |
|---|---|---|---|
| 2,843,740 | 7/1958 | Mantz | 331—2 |
| 2,888,562 | 5/1959 | Robinson | 331—2 |

ROY LAKE, *Primary Examiner.*

S. H. GRIMM, *Assistant Examiner.*